(12) United States Patent
Usukura

(10) Patent No.: US 12,276,797 B2
(45) Date of Patent: Apr. 15, 2025

(54) DISPLAY DEVICE AND HEAD-MOUNTED DISPLAY

(71) Applicant: Sharp Display Technology Corporation, Kameyama (JP)

(72) Inventor: Naru Usukura, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/136,272

(22) Filed: Apr. 18, 2023

(65) Prior Publication Data

US 2023/0341687 A1 Oct. 26, 2023

(30) Foreign Application Priority Data

Apr. 20, 2022 (JP) .................. 2022-069602

(51) Int. Cl.
*G02B 27/01* (2006.01)
*G02B 5/30* (2006.01)
(Continued)

(52) U.S. Cl.
CPC ....... *G02B 27/0172* (2013.01); *G02B 5/3016* (2013.01); *G02B 5/3083* (2013.01);
(Continued)

(58) Field of Classification Search
CPC ............ G02B 27/0172; G02B 27/0101; G02B 27/017; G02B 27/286; G02B 5/3016;
(Continued)

(56) References Cited

U.S. PATENT DOCUMENTS

| 6,094,242 A | 7/2000 | Yamanaka |
|---|---|---|
| 6,271,969 B1 | 8/2001 | Mertz |

(Continued)

FOREIGN PATENT DOCUMENTS

| JP | 3295583 B2 | 6/2002 |
|---|---|---|
| JP | 4408159 B2 | 2/2010 |

(Continued)

OTHER PUBLICATIONS

Andrew Maimone et al. "Holographic Optics for Thin and Lightweight Virtual Reality", ACM Trans. Graph., vol. 39, No. 4, Article 67. Publication date: Jul. 2020.

*Primary Examiner* — Angela M. Medich
(74) *Attorney, Agent, or Firm* — ScienBiziP, P.C.

(57) ABSTRACT

Provided is a display device having a thin profile and a high light use efficiency and a head-mounted display including the display device. The display device includes a display panel; a circular polarizer configured to convert display light from the display panel into circularly polarized light and to transmit the circularly polarized light; a patterning mirror including light transmitters and a light reflector, the light transmitters being configured to transmit the circularly polarized light and the light reflector being provided on a surface opposite to a surface facing the circular polarizer; a lens configured to transmit the circularly polarized light transmitted through the patterning mirror; and a circularly polarized light selective reflector configured to selectively reflect the circularly polarized light transmitted through the lens.

20 Claims, 14 Drawing Sheets

(51) Int. Cl.
 *G02F 1/1335* (2006.01)
 *G02F 1/13363* (2006.01)
 *H10K 59/80* (2023.01)

(52) U.S. Cl.
 CPC .. *G02F 1/133526* (2013.01); *G02F 1/133541* (2021.01); *G02F 1/133638* (2021.01); *H10K 59/879* (2023.02); *H10K 59/8793* (2023.02)

(58) Field of Classification Search
 CPC ... G02B 5/30; G02B 5/3083; G02F 1/133541; G02F 1/133553; G02F 1/133536; G02F 2201/307
 See application file for complete search history.

(56) References Cited

U.S. PATENT DOCUMENTS

| | | |
|---|---|---|
| 6,304,303 B1 | 10/2001 | Yamanaka |
| 2018/0039052 A1 | 2/2018 | Khan et al. |
| 2018/0180889 A1 | 6/2018 | Lee et al. |
| 2018/0246373 A1* | 8/2018 | Nakamura ........... G02B 6/0053 |
| 2019/0146198 A1 | 5/2019 | Khan et al. |
| 2020/0073123 A1* | 3/2020 | Martinez .............. G02B 27/288 |
| 2020/0166738 A1 | 5/2020 | Khan et al. |
| 2021/0132349 A1 | 5/2021 | Khan et al. |
| 2022/0350148 A1* | 11/2022 | Ouderkirk ......... G02F 1/133638 |

FOREIGN PATENT DOCUMENTS

| | | |
|---|---|---|
| JP | 5018758 B2 | 9/2012 |
| JP | 6687805 B2 | 4/2020 |
| JP | 6777622 B2 | 10/2020 |

\* cited by examiner

DISPLAY DEVICE AND HEAD-MOUNTED DISPLAY

CROSS-REFERENCE TO RELATED APPLICATIONS

The present application claims priority under 35 U.S.C. § 119 to Japanese Patent Application No. 2022-069602 filed on Apr. 20, 2022, the contents of which are incorporated herein by reference in their entirety.

BACKGROUND OF THE INVENTION

Field of the Invention

The present disclosure relates to display devices and head-mounted displays including the display devices.

Description of Related Art

A head-mounted display (HMD) is a display device that displays an image and allows a user to see the image while it is worn on the head of the user. An example of the HMD is an immersive HMD that covers both eyes and allows the user to see the display of the HMD in the entire field of view. The immersive HMD can block the outside light and give a sense of deep immersion, and is also referred to as a virtual reality (VR) device.

Recently, compact HMDs have been awaited. In order to achieve compact HMDs, folded optical systems utilizing the characteristics of polarization are developed (JP 3295583 B, JP 5018758 B, JP 4408159 B, JP 6687805 B, and JP 6777622 B). With regard to the folded optical system, for example, FIG. 5 of JP 3295583 B discloses a HMD including a backlight, a liquid crystal panel, a ¼ wavelength plate, a one-way mirror, a lens, and a circularly polarized light selective one-way mirror. JP 5018758 B and JP 6777622 B also disclose HMDs each including a one-way mirror (half mirror).

CITATION LIST

Non-Patent Literature

Non-Patent Literature 1: ACM Transactions on Graphics, U.S., 2020, Vol. 39, No. 4, Article 67

BRIEF SUMMARY OF THE INVENTION

A folded optical system HMD including a half mirror is expected to have a thin profile, while has a low light use efficiency and leaves room for improvement. A folded optical system HMD including a half mirror suffers loss of the incident light by 50% at each of the two occasions when the light emitted from the backlight passes through the half mirror. Thus, theoretically, only 25% of the light can be used for an image to be observed. Increasing the luminance of the backlight can compensate for the luminance of the HMD. Still, reducing the electric energy consumption is also important because, for example, battery-powered wireless HMDs have been awaited and HMDs with reduced heat generation in the housings have been awaited.

In response to the above issues, the present invention aims to provide a display device having a thin profile and a high light use efficiency, as well as a head-mounted display including the display device.

(1) An embodiment of the present invention is directed to a display device including a display panel; a circular polarizer configured to convert display light from the display panel into circularly polarized light and to transmit the circularly polarized light; a patterning mirror including light transmitters and a light reflector, the light transmitters being configured to transmit the circularly polarized light and the light reflector being provided on a surface opposite to a surface facing the circular polarizer; a lens configured to transmit the circularly polarized light transmitted through the patterning mirror; and a circularly polarized light selective reflector configured to selectively reflect the circularly polarized light transmitted through the lens.

(2) In an embodiment of the present invention, the display device includes the structure (1) and the light transmitters each overlap at least one of pixels in the display panel.

(3) In an embodiment of the present invention, the display device includes the structure (1) or (2) and the display panel includes an organic light emitting diode or a quantum dot light emitting diode.

(4) In an embodiment of the present invention, the display device includes the structure (3) and the circular polarizer includes a stack of a first linear polarizer and a ¼ wavelength plate.

(5) In an embodiment of the present invention, the display device includes the structure (3) and the circular polarizer is a cholesteric liquid crystal element.

(6) In an embodiment of the present invention, the display device includes the structure (1) or (2), the display panel is a liquid crystal panel including a pair of substrates and a liquid crystal layer between the substrates, the circular polarizer includes a stack of a first linear polarizer and a ¼ wavelength plate, and the display panel further includes a second linear polarizer remote from the circular polarizer.

(7) In an embodiment of the present invention, the display device includes the structure (6) and further includes a backlight facing the second linear polarizer and remote from the liquid crystal panel, the backlight including a light source, and the backlight is configured to focus light emitted from the light source in a direction along a thickness direction of the liquid crystal panel.

(8) In an embodiment of the present invention, the display device includes any one of the structures (1) to (7) and the circularly polarized light selective reflector includes a stack of a reflective linear polarizer and a ¼ wavelength plate.

(9) In an embodiment of the present invention, the display device includes any one of the structures (1) to (7) and the circularly polarized light selective reflector is a cholesteric liquid crystal element.

(10) In an embodiment of the present invention, the display device includes any one of the structures (1) to (9) and further includes a focusing lens between the display panel and the circular polarizer, the focusing lens overlapping at least one of the light transmitters.

(11) In an embodiment of the present invention, the display device includes any one of the structures (1) to (10) and further includes a focusing lens between the circular polarizer and the patterning mirror, the focusing lens overlapping at least one of the light transmitters.

(12) Another embodiment of the present invention is directed to a head-mounted display including the display device including any of the structures (1) to (11) and a mounting part to be mounted on a head.

The present invention provides a display device having a thin profile and a high light use efficiency as well as a head-mounted display including the display device.

DETAILED DESCRIPTION OF THE INVENTION

Hereinafter, embodiments of the present invention are described with reference to the drawings, but the present invention is not limited to these embodiments.

Embodiment 1

A display device according to Embodiment 1 is a display device including a display panel; a circular polarizer configured to convert the display light from the display panel into circularly polarized light and to transmit the circularly polarized light; a patterning mirror including light transmitters and a light reflector, with the light transmitters being configured to transmit the circularly polarized light and with the light reflector being provided on the surface opposite to the surface facing the circular polarizer; a lens configured to transmit the circularly polarized light transmitted through the patterning mirror; and a circularly polarized light selective reflector configured to selectively reflect the circularly polarized light transmitted through the lens.

Figure 1:
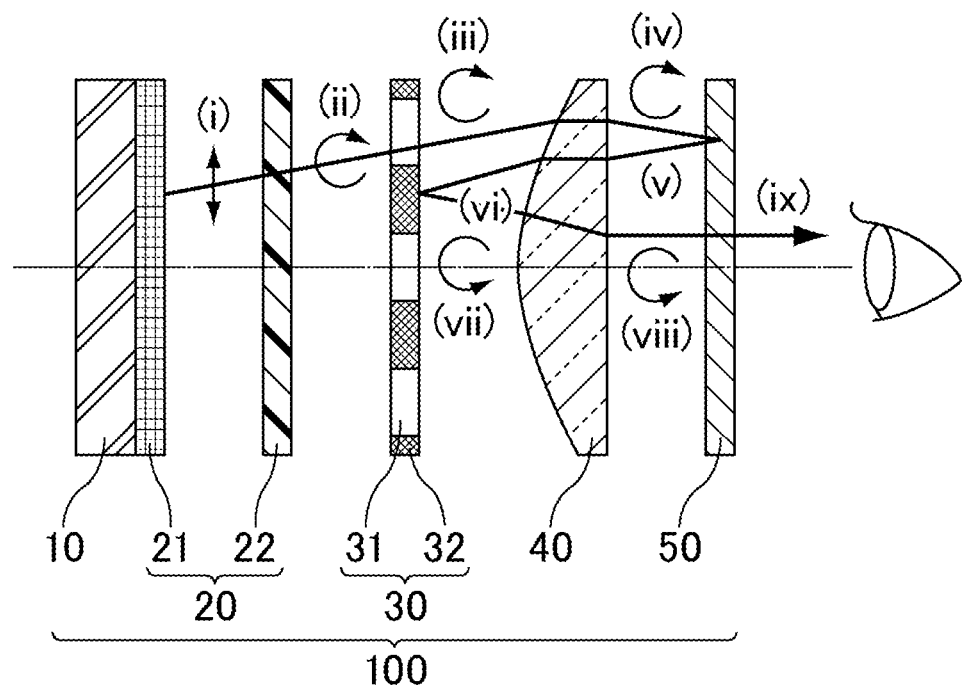
FIG. 1 is an exploded schematic cross-sectional view of a display device according to Embodiment 1.

FIG. 1 is an exploded schematic cross-sectional view of the display device according to Embodiment 1. As shown in FIG. 1, a display device 100 according to Embodiment 1 includes, sequentially toward the viewer side, a display panel 10, a circular polarizer 20, a patterning mirror 30, a lens 40, and a circularly polarized light selective reflector 50. FIG. 1 shows an example where the circular polarizer 20 includes a stack of a first linear polarizer 21 and a ¼ wavelength plate 22. In the exploded cross-sectional views herein, the components are illustrated in spacing. Still, the components may be bonded to each other or may be spaced with each other.

The display panel 10 emits light (display light) toward the viewer side and the first linear polarizer 21 converts the display light from the display panel 10 into linearly polarized light ((i) in FIG. 1). The linearly polarized light transmitted through the ¼ wavelength plate 22 is converted into circularly polarized light ((ii) in FIG. 1). In the case where the circularly polarized light is right-handed circularly polarized light, the right-handed circularly polarized light passes through a light transmitter 31 of the patterning mirror 30 and passes through the lens 40 without changing the rotating direction ((iii) and (iv) in FIG. 1). The circularly polarized light selective reflector 50 selectively reflects the right-handed circularly polarized light ((v) in FIG. 1) and the reflected right-handed circularly polarized light again passes through the lens 40 ((vi) in FIG. 1). The right-handed circularly polarized light transmitted through the lens 40 is reflected on a light reflector 32 of the patterning mirror 30 and is converted into left-handed circularly polarized light ((vii) in FIG. 1). The left-handed circularly polarized light again passes through the lens 40 ((viii) in FIG. 1), passes through the circularly polarized light selective reflector 50, and is emitted toward the viewer side ((ix) in FIG. 1). The "viewer side" herein means the side closer to the screen (display surface) of the display. The "back surface side" herein means the side farther from the screen (display surface) of the display.

The display device 100 according to Embodiment 1, which is structured as a folded optical system causing reflection of the light between the patterning mirror 30 and the circularly polarized light selective reflector 50, folds the light (display light) from the display panel 10 toward the viewer side and emits the folded light toward the viewer side. Thus, the display device 100 can have a long optical path while having a small thickness. Use of not a half mirror used for conventional HMDs but the patterning mirror 30 can improve the light use efficiency.

(Display Panel)

The display panel 10 preferably includes pixels. The pixel refers to a display unit for image display. In the case of color display, the pixels may include red, blue, and green pixels, for example.

The display panel 10 may include a TFT substrate including thin-film transistors (TFTs) arranged thereon. The TFT substrate includes, on a support substrate, parallel gate lines and parallel source lines extending in the direction intersecting the gate lines with a gate insulator in between. The gate lines and the source lines may form a grid pattern in a plan view. Each of the regions defined by the gate lines and the source lines corresponds to a pixel.

The support substrate is preferably a transparent substrate, such as a glass substrate or a plastic substrate.

At each intersection of a gate line and a source line may be provided a TFT as a switching element for each pixel. The gate terminal of a TFT may be connected to a gate line, the source terminal thereof may be connected to a source line, and the drain terminal thereof may be connected to a pixel electrode. In addition to the pixel electrodes, the display panel 10 may include a common electrode to be supplied with a common electrode voltage.

The display device 100 according to Embodiment 1 may include an organic light emitting diode (OLED) panel including OLEDs, or may include a quantum dot-light emitting diode (QD-LED) panel including QD-LEDs. Herein, in the case where the OLED and the QD-LED are not distinguished, they are also collectively referred to as a light emitting diode (LED).

The light emitting diode may have any structure, and may have a structure in which a cathode, an electron-transport layer, a light-emitting layer, a hole-transport layer, and an anode are stacked in the stated order.

Examples of the material of the cathode and the anode include, but are not limited to, transparent conductive materials such as indium tin oxide (ITO), indium zinc oxide (IZO), $In_2O_3$, $SnO_2$, and Zno, aluminum, silver, and any alloy of these.

In the case of a top emission LED, the pixel electrodes of the TFT substrate may be used as an anode while the common electrode may be used as a cathode. The anode may be a reflective electrode of aluminum, silver, or an alloy of these, while the cathode may be a transparent conductive material.

The hole-transport layer is a layer that transports holes injected from the anode to the light-emitting layer. Examples of the material of the hole-transport layer include, but are not limited to, amine-based compounds such as N,N,N',N'-tetraphenylbenzidine and derivatives thereof.

The electron-transport layer is a layer that transports electrons injected from the cathode to the light-emitting layer. Examples of the material of the electron-transport layer include, but are not limited to, phenanthroline derivatives such as 2,9-dimethyl-4,7-diphenyl-1,10-phenanthroline (BCP), quinoline derivatives such as tris(8-quinolinolato)aluminum (Alq3), azaindolizine derivatives, oxadiazole derivatives, perylene derivatives, pyridine derivatives, pyrimidine derivatives, quinoxaline derivatives, diphenylquinone derivatives, and nitro-substituted fluorene derivatives.

An electron-injection layer may be provided between the cathode and the electron-transport layer. A hole-injection layer may be provided between the anode and the hole-transport layer. The material of the electron-injection layer may be an inorganic insulating material, such as an oxide or halide of an alkali metal or an oxide or halide of an alkaline earth metal.

In the case where the display panel 10 is an OLED, the light-emitting layer may contain a fluorescent material or a phosphorescent material as a light-emitting material.

A red fluorescent material may be any material emitting red fluorescence. Examples thereof include perylene derivatives such as tetraaryl diindenoperylene derivatives, europium complexes, benzopyrane derivatives, rhodamine derivatives, benzothioxanthene derivatives, and porphyrin derivatives.

A green fluorescent material may be any material emitting green fluorescence. Examples thereof include cumarin derivatives, quinacridone derivatives, and anthracene derivatives.

A blue fluorescent material may be any material emitting blue fluorescence. Examples thereof include distyrylamine derivatives, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, and tetraphenylbutadiene.

The phosphorescent material may be any material emitting phosphorescence. Examples thereof include complexes of metal such as iridium, ruthenium, platinum, osmium, rhenium, and palladium. Each metal complex preferably satisfies that at least one ligand has a skeleton such as a phenylpyridine skeleton, a bipyridyl skeleton, or a porphyrin skeleton.

Examples of a red phosphorescent material include tris(1-phenylisoquinoline)iridium, bis[2-(2'-benzo[4,5-α]thienyl)pyridinato-N, C3']iridium(acetylacetonate) (btp2Ir(acac)), 2, 3, 7, 8, 12, 13, 17, 18-octaethyl-12H, 23H-porphyrin-platinum(II), bis[2-(2'-benzo[4,5-α]thienyl)pyridinato-N, C3']iridium, and bis(2-phenylpyridine)iridium (acetylacetonate).

Examples of a green phosphorescent material include fac-tris(2-phenylpyridine)iridium (Ir(ppy)3), bis(2-phenylpyridinato-N, C2') iridium (acetylacetonate), and fac-tris[5-fluoro-2-(5-trifluoromethyl-2-pyridine)phenyl-C, N]iridium.

Examples of a blue phosphorescent material include bis[4,6-difluorophenylpyridinato-N,C2']-picolinate-iridium, tris[2-(2,4-difluorophenyl)pyridinato-N,C2']iridium, bis[2-(3,5-trifluoromethyl)pyridinato-N,C2']-picolinate-iridium, and bis(4,6-difluorophenylpyridinato-N,C2')iridium(acetylacetonate).

The fluorescent material and the phosphorescent material are also referred to as dopants. The light-emitting layer may contain a host material that transports electric charges to a dopant. Examples of the host material include acene derivatives (acene compounds) such as anthracene derivatives and tetracene derivatives, quinolinolate metal complexes such as distyrylarylene derivatives, perylene derivatives, distyrylbenzene derivatives, distyrylamine derivatives, and a tris(8-quinolinolato)aluminum complex (Alq3), triaryl amine derivatives such as a tetramer of triphenylamine, dicarbazole derivatives such as oxadiazole derivatives, silole derivatives, 3-phenyl-4-(1'-naphthyl)-5-phenylcarbazole, and 4,4'-N,N'-dicarbazole biphenyl (CBP), oligothiophene derivatives, benzopyrane derivatives, triazole derivatives, benzoxazole derivatives, benzothiazole derivatives, quinoline derivatives, and 4,4'-bis(2,2'-diphenylvinyl)biphenyl (DPVBi). These may be used in combination with a fluorescent material or a phosphorescent material as appropriate.

In the case where the display panel 10 is a QD-LED panel, the light-emitting layer may contain a quantum dot material as a light-emitting material. Quantum dots are nanoscale (e.g., having an average particle size of 2 to 10 nm) semiconductor crystals having optical characteristics that follow the quantum mechanics. Examples thereof include colloidal particles composed of 10 to 50 atoms.

Examples of the quantum dot material include compounds such as cadmium selenide (CdSe), cadmium telluride (CdTe), cadmium sulfide (CdS), lead sulfide (PbS), and indium phosphide (InP), and those containing an alloy such as CdSeS.

Examples of the quantum dots include core quantum dots composed of semiconductor crystals having a single, uniform inner composition, alloy quantum dots composed of an alloy of multiple semiconductors, and core-shell quantum dots composed of core quantum dots or alloy quantum dots with the surface covered with a semiconductor compound. Adjusting the particle size of the quantum dots enables control of the peak of the emission wavelength. Changing the composition or inner structure of quantum dots enables control of the optical features and electronic features.

Each pixel may be provided with a light emitting diode (OLED or QD-LED). In the case of an OLED panel or a QD-LED panel, each red pixel, each green pixel, and each blue pixel may be provided with a red LED (OLED or QD-LED) including a light-emitting layer containing a red light-emitting material, a green LED including a light-emitting layer containing a green light-emitting material, and a blue LED including a light-emitting layer containing a blue light-emitting material, respectively.

Combining the fluorescent materials or the phosphorescent materials can provide an OLED that emits white fluorescence or phosphorescence. In the case of an OLED panel, a white OLED may be covered with a color filter including a red resin layer, a green resin layer, and a blue resin layer so that red pixels, green pixels, and blue pixels may be provided.

In the case of a QD-LED panel, a quantum dot layer of a single color, such as white or blue, may be covered with a color OLED layer including a red OLED, a green OLED, and a blue OLED or a color filter so that red pixels, green pixels, and blue pixels may be provided.

The pixels may be provided in any arrangement. For example, the pixels may be provided in the pentile arrangement in which the number of the green pixels is double the number of the red pixels and the number of the blue pixels or in the real RGB arrangement in which the red pixels, the green pixels, and the blue pixels are arranged at a ratio of 1:1:1.

Figure 2:
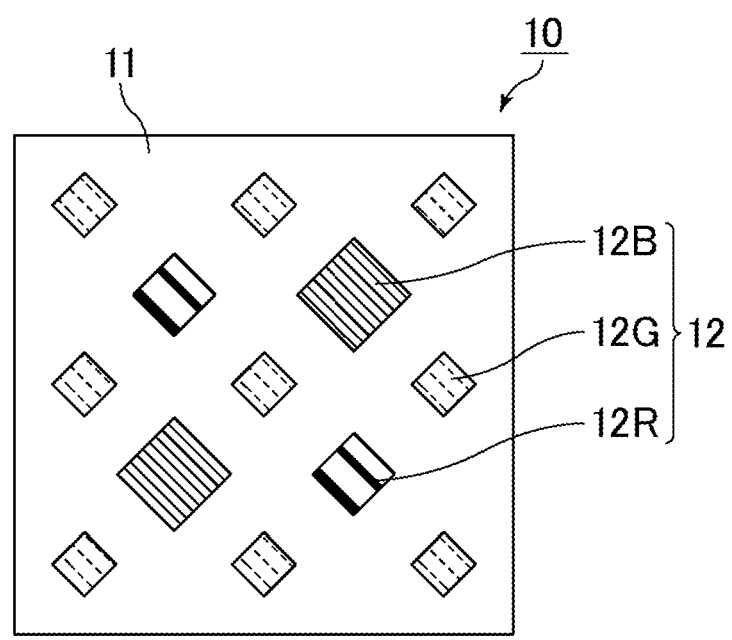
FIG. 2 is a schematic plan view of an example of a display panel including light emitting diodes.

FIG. 2 is a schematic plan view of an example of a display panel including light emitting diodes. FIG. 2 shows an example of the pentile arrangement. As shown in FIG. 2, the display panel 10 may include light emitting diodes 12 including red LEDs 12R, green LEDs 12G, and blue LEDs 12B on a substrate 11. The pixels provided with the red LEDs 12R, the pixels provided with the green LEDs 12G, and the pixels provided with the blue LEDs 12B respectively correspond to red pixels, green pixels, and blue pixels. The substrate 11 may be a TFT substrate.

In the pentile arrangement, the LEDs may occupy 20% to 40% of the display screen (display region) of the display panel 10. In the case of the pentile arrangement where the red, blue, and green LEDs have the same size, each LED may have a diameter of 2 to 30 μm, for example. The size of the red and blue pixels may be greater than the size of the green pixels. In the case of the pentile arrangement where the size is different among the colors, the red LEDs may have a diameter of 2 to 25 μm, the green LEDs may have a diameter of 2 to 25 μm, and the blue LEDs may have a diameter of 5 to 30 μm. The diameter of a LED refers to the maximum length in a plan view.

In order to efficiently transmit the light through the light transmitters 31 of the patterning mirror 30, the pixels are preferably small. In the case where the red LEDs 12R, the green LEDs 12G, and the blue LEDs 12B are provided at a ratio of 1:1:1, each LED may have a diameter of 2 to 10 μm, for example. Use of these micro LEDs can lead to a high resolution. For example, in the case where the pixel size (diameter of LED) is 5 μm and the patterning mirror 30 is provided with 10-μm-square light transmitters 31, the resolution is 1000 ppi and the aperture ratio is 5%.

(Circular Polarizer)

Figure 3:
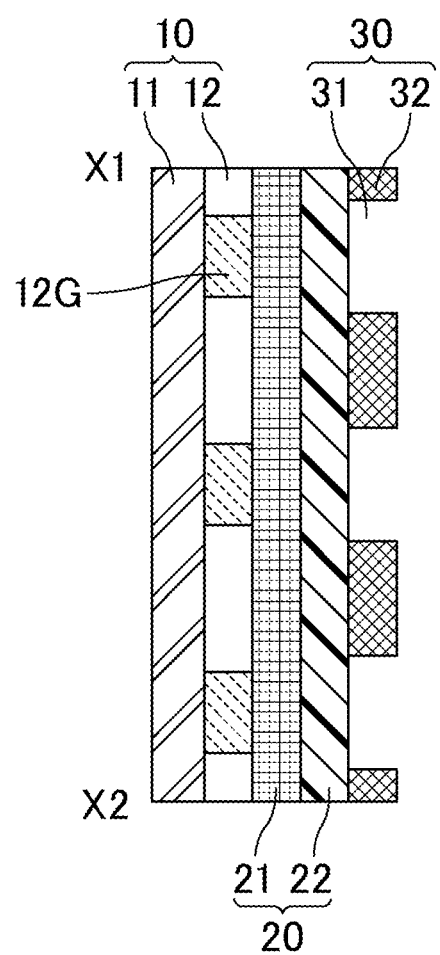
FIG. 3 is a schematic cross-sectional view of an example in which a circular polarizer includes a stack of a first linear polarizer and a ¼ wavelength plate.

The circular polarizer 20 converts the display light from the display panel 10 into circularly polarized light and transmits the circularly polarized light. A combination of a linear polarizer and a ¼ wavelength plate can function as a circular polarizer. FIG. 3 is a schematic cross-sectional view of an example in which the circular polarizer includes a stack of a first linear polarizer and a ¼ wavelength plate. As described above, the first linear polarizer 21 converts the display light into linearly polarized light ((i) in FIG. 1) while the ¼ wavelength plate 22 converts the linearly polarized light into circularly polarized light ((ii) in FIG. 1).

Figure 4:
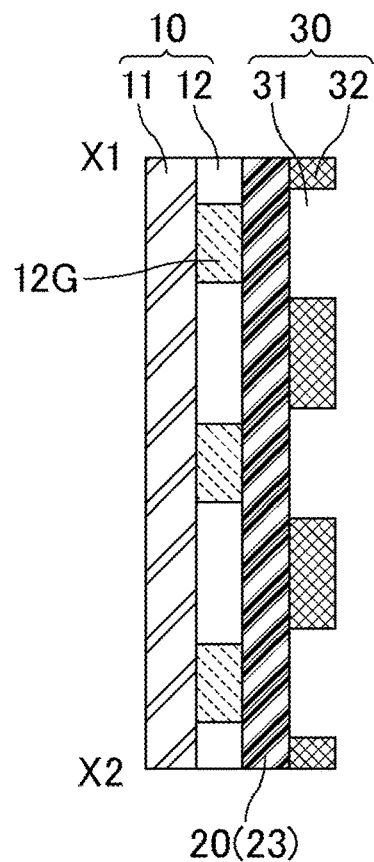
FIG. 4 is a schematic cross-sectional view of an example in which a circular polarizer is a cholesteric liquid crystal element.

As shown in FIG. 3, the display panel 10 and the circular polarizer 20 may be stacked and the circular polarizer 20 and the patterning mirror 30 may be stacked without any air layer. This structure can shorten the distance between the display panel 10 and the patterning mirror 30 and reduce the loss of light, so that more light can focus on the light transmitters 31 of the patterning mirror 30, resulting in an improved luminance of the display device 100. FIG. 3 and FIG. 4 to be described later each correspond to a schematic cross-sectional view taken along the X1-X2 line in FIG. 6 to be described later.

The first linear polarizer 21 may be any polarizer that transmits linearly polarized light having a specific vibrating direction and may be a polarizer common in the field of display devices. The linear polarizer may be of either an absorptive type or a reflective type.

The absorptive polarizer refers to a polarizer having a function of absorbing light vibrating in a specific direction and transmitting polarized light (linearly polarized light) vibrating in the direction perpendicular thereto. The absorptive polarizer has a transmission axis and an absorption axis perpendicular to the transmission axis. An example of the absorptive linear polarizer is one including a uniaxially stretched film of polyvinyl alcohol adsorbing iodine compound molecules thereon and triacetyl cellulose (TAC) films sandwiching the polyvinyl alcohol film.

The reflective polarizer refers to a polarizer having a function of reflecting light vibrating in a specific direction and transmitting polarized light (linearly polarized light) vibrating in the direction perpendicular thereto. The reflective polarizer has a transmission axis and a reflection axis perpendicular to the transmission axis. Examples of the reflective linear polarizer include a reflective polarizer obtainable by uniaxially stretching a co-extruded film of two resins (e.g., APCF available from Nitto Denko Corp. and DBEF available from 3M Co.) and a wire grid polarizer including metal thin lines arranged. An example of the wire grid polarizer is one in which metal thin lines having a diameter of about 10 to 100 μm are arranged at a pitch of 20 to 200 μm.

The ¼ wavelength plate 22 may be any retarder that provides a ¼ phase difference to incident light. The ¼ wavelength plate 22 refers to, for example, a retarder that provides an in-plane phase difference of ¼ wavelength (exactly, 137.5 nm) to light having a wavelength of 550 nm, and may provide an in-plane phase difference of 120 nm or greater and 150 nm or smaller.

The circular polarizer 20 may be a cholesteric liquid crystal element 23. FIG. 4 is a schematic cross-sectional view of an example in which the circular polarizer is a cholesteric liquid crystal element. In the case where the circular polarizer 20 is a cholesteric liquid crystal element 23, the cholesteric liquid crystal element 23 converts the display light emitted from the display panel 10 into circularly polarized light ((ii) in FIG. 1).

Herein, when the light is observed facing the light-travelling direction, the light in which the vibrating direction of the electric displacement vector of the light waves rotates clockwise as the light waves travel is referred to as right-handed circularly polarized light, while the light in which the vibrating direction rotates counterclockwise as the light waves travel is referred to as left-handed circularly polarized light. The circularly polarized light encompasses not only perfectly circularly polarized light (ellipticity (minor axis/major axis)=1.00), but also elliptically polarized light having an ellipticity of not lower than 0.90 but lower than 1.00.

An example of the cholesteric liquid crystal element 23 is one including a cholesteric liquid crystal layer containing cholesteric liquid crystal between paired substrates. Alignment treatment on the substrates for control of the alignment azimuth of the cholesteric liquid crystal can provide a cholesteric liquid crystal element that reflects either right-handed or left-handed circularly polarized light and transmits the other circularly polarized light. The cholesteric liquid crystal layer can be produced with a thickness of several micrometers, which enables a short distance between the display panel 10 and the patterning mirror 30. The substrate of the display panel 10 on the viewer side may be used as a support substrate and the surface of this substrate of the display panel 10 on the viewer side may be provided with a cholesteric liquid crystal layer.

(Patterning Mirror)

The display device 100 according to Embodiment 1 includes a patterning mirror instead of a conventional half mirror. Using a patterning mirror can increase the light use efficiency in both transmission and reflection. This can provide a high luminance of the display device 100 as a whole, leading to a HMD with reduced electric energy consumption.

Figure 5:
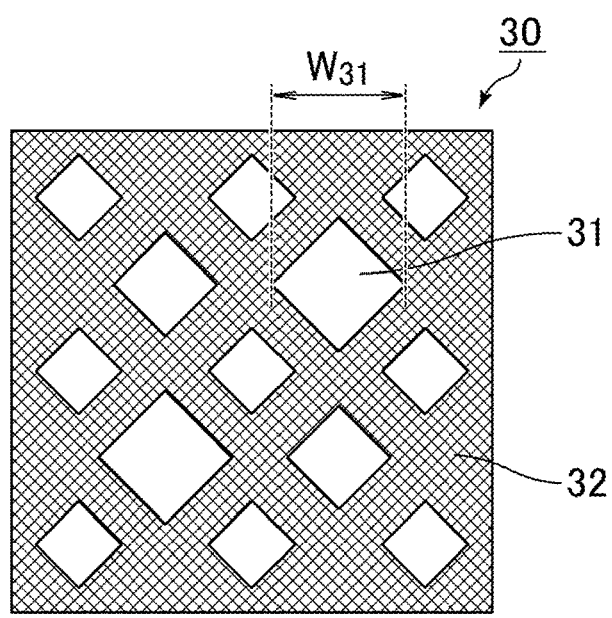
FIG. 5 is a schematic plan view of an example of a patterning mirror.

FIG. 5 is a schematic plan view of an example of the patterning mirror. As shown in FIG. 5, the patterning mirror 30 includes light transmitters 31 and a light reflector 32. The light transmitters 31 transmit the circularly polarized light emitted from the circular polarizer 20 without changing the rotating direction. A conventional half mirror loses 50% of the light in transmission of the light. In contrast, the patterning mirror 30 allows the circularly polarized light to pass through the light transmitters 31. Accordingly, a larger amount of light can enter the lens 40.

The light reflector 32 is provided on the surface opposite to the surface of the patterning mirror 30 facing the circular polarizer 20. The light transmitted through the lens 40, selectively reflected on the circularly polarized light selective reflector 50, and again transmitted through the lens 40 is again reflected on the light reflector 32 toward the lens 40. Reflection on the light reflector 32 reverses the rotating direction of the circularly polarized light. A conventional half mirror loses 50% of the light in reflection of the light. In contrast, reflection on the light reflector 32 allows a larger amount of light to enter the lens 40 again.

The light reflector 32 is provided on the surface opposite to the surface of the patterning mirror 30 facing the circular polarizer 20. The surface of the patterning mirror 30 facing the circular polarizer 20 (the surface close to the display panel 10) may not be provided with a light reflector. In common cases where a reflector body is formed by vapor deposition, for example, the back side also becomes a light reflector. In this case, the reflected light can contribute to image display, which results in a high light use efficiency. Still, if the pixels and the patterning mirror are apart from each other by a great distance, images may be blurred. Thus, the surface close to the display panel 10 is preferably provided with a light absorber body such as a resin, e.g., a black resist, or a metal, e.g., chromium.

The light reflector 32 has a reflectance of preferably 83% or higher, more preferably 90% or higher, still more preferably 95% or higher. The reflectance refers to the visible light reflectance standardized by JIS R 3220 "Glass in building—Silvered, flat-glass mirror".

The light transmitters 31 have a transmittance of preferably 90% or higher, more preferably 95% or higher. The transmittance refers to the total light transmittance standardized in JIS K 7375.

Figure 6:
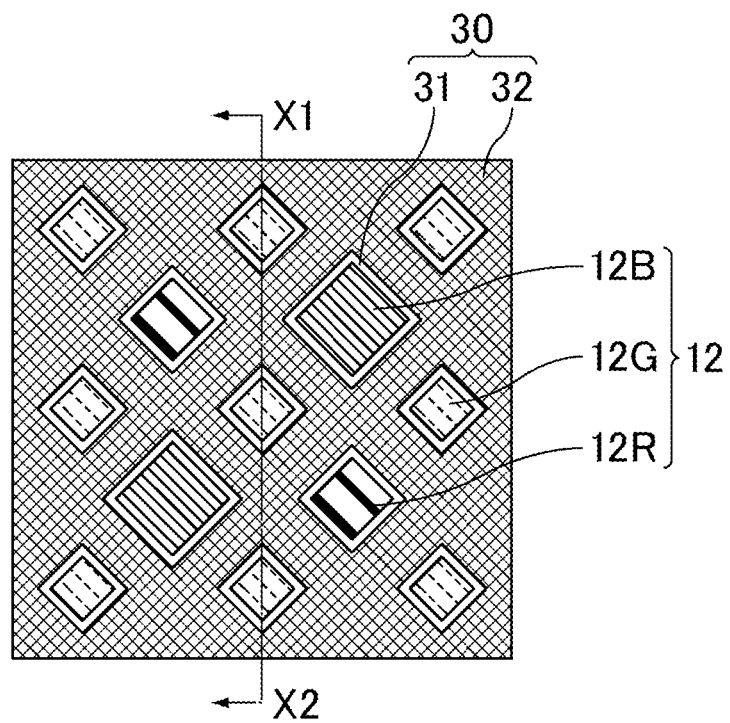
FIG. 6 is a schematic plan view of an overlapping structure of the display panel in FIG. 2 and the patterning mirror in FIG. 5.

FIG. 6 is a schematic plan view of an overlapping structure of the display panel in FIG. 2 and the patterning mirror in FIG. 5. As shown in FIG. 6, in a plan view, the light reflector 32 may extend to the vicinity of the outer edge of a pixel. The distance between the outer edge of a pixel and the light reflector 32 may be 1 to 5 μm, for example.

The patterning mirror 30 has an aperture ratio of preferably 5% or higher and 40% or lower. The aperture ratio preferably falls within this range in consideration of the balance between the amount of light to be transmitted through the light transmitters 31 of the patterning mirror 30 and the amount of light to be reflected on the light reflector 32 of the patterning mirror 30. The aperture ratio is more preferably 10% or higher and 20% or lower.

The aperture ratio of the patterning mirror 30 can be determined by the following formula. In the formula, the "surface area of patterning mirror" refers to the total area of the light transmitters 31 and the light reflector 32. The "surface area of patterning mirror" also refers to the surface area of the patterning mirror 30 overlapping the display region of the display panel 10 where the pixels of the display panel 10 are provided, excluding the area of the patterning mirror 30 overlapping the frame region of the display panel 10. For example, the aperture ratio corresponds to the ratio of the total area of the light transmitters of the patterning mirror overlapping the area of one cycle (e.g., the square defined by linking the central points of the peripheral 8 pixels of 3 pixels×3 pixels including, in the center thereof, a green LED 12G in FIG. 6) on the display region of the display panel 10 to this area of one cycle.

Aperture ratio of patterning mirror (%)=(total area of light transmitters/surface area of patterning mirror)×100

The light transmitters 31 may be provided at a position overlapping the display region of the display panel 10. The light transmitters 31 each may overlap at least one of the pixels, which enables efficient transmission of the light emitted from the display panel 10 through the light transmitters 31. One light transmitter 31 may overlap part of one pixel, or may overlap the whole of one pixel as shown in FIG. 6.

Examples of the shape of one light transmitter 31 in a plan view (hereinafter, also referred to as a planar shape) include regular polygons such as a square, a rectangle, a rhombus, a circle, an oval, and any combination of these. In a plan view of the display device 100 seen from the viewer side, each light transmitter 31 can also be regarded as being surrounded by the light reflector 32.

The light transmitters 31 each may have a diameter $W_{31}$ of 2 to 30 μm. The diameter of each light transmitter 31 is more preferably 5 to 15 μm. The diameter of each light transmitter 31 refers to the maximum length of one light transmitter 31. The sizes of the light transmitters 31 may be changed as appropriate in accordance with the sizes of the pixels of the display panel 10. The light transmitters 31 may have the same size, or light transmitters 31 of different sizes may be provided as shown in FIG. 5.

The light transmitters 31 may be arranged as appropriate in accordance with the arrangement of the pixels of the display panel 10. They may be arranged in a matrix pattern in the row and column directions, or may be arranged such that every other row is shifted in the row direction by a half row, or may be arranged such that every other column is shifted by a half column in the column direction.

An example of the patterning mirror 30 is one including a glass or resin plate and, on the surface thereof, a film of a metal such as aluminum, silver, titanium, or tungsten. This may be prepared by masking a substrate, such as a glass plate or a resin plate, at portions corresponding to the light transmitters 31 and forming a metal film. The portion provided with the metal film corresponds to the light reflector 32, while the portions not provided with the metal film correspond to the light transmitters 31.

The metal film may be formed by any method such as metal vapor deposition or sputtering. The metal film may have a thickness of 50 to 200 nm, for example.

In order to achieve a small thickness of the display device 100 and reduce the loss of display light, a metal film may be provided on the surface of an adjacent circular polarizer 20 (in FIG. 1, the ¼ wavelength plate 22) opposite to the display device 100 without any other substrate.

Another method of forming the patterning mirror 30 includes preparing a mirror and physically removing the portions corresponding to the light transmitters 31, whereby the remaining mirror portion is used as the light reflector 32.
(Lens)

The lens 40 transmits the circularly polarized light transmitted through the patterning mirror 30. The lens 40 enables visual confirmation of an enlarged image (virtual image) of the display image displayed on the display panel 10.

The lens 40 may be any component that enlarges the image on the display panel 10, and is preferably an aspheric lens designed to focus the light transmitted through the lens 40 onto the eyes of a viewer. The lens 40 may be a refractive lens or may be a diffractive lens.

The refractive lens may be any one commonly used in the field of HMDs, and examples thereof include refractive lenses having a curved surface (convex surface), such as a plano convex lens, a double convex lens, and a meniscus lens. A Fresnel lens may be used in combination. The refractive lens is preferably placed such that the convex surface is close to the display panel 10. The refractive lens may be an achromatic lens in which two lenses having different wavelength dispersions are attached to each other or a combination of multiple lenses. For example, an optical system including two lenses is commonly used to appropriately achieve the lens power. One of these two lenses, a lens closer to the display device, may be a double convex lens, while the other lens closer to a viewer may be a plano convex lens in which a convex Fresnel lens is provided close to the panel.

An example of the diffractive lens is a transmissive holographic optical element. A transmissive holographic optical element used as a diffractive lens can utilize the diffraction of light to form an image of the display panel 10. A hologram film to be used may be one provided with desired optical characteristics owing to interference exposure using light beams corresponding to incident light and emitted light. A hologram film may be produced by achieving desired optical characteristics by exposure for small areas, which is currently referred to as computer generated hologram (CGH).
(Circularly Polarized Light Selective Reflector)

The circularly polarized light selective reflector 50 selectively reflects the circularly polarized light transmitted through the lens 40. Preferably, the circularly polarized light selective reflector 50 reflects circularly polarized light rotating in the same direction as the circularly polarized light transmitted through the circular polarizer 20 and transmits circularly polarized light rotating in the direction opposite to the circularly polarized light transmitted through the circular polarizer 20. For example, in the case where the circularly polarized light transmitted through the circular polarizer 20 rotates clockwise, the circularly polarized light selective reflector 50 reflects right-handed circularly polarized light and transmits left-handed circularly polarized light.

The circularly polarized light selective reflector 50 may include a stack of a reflective linear polarizer and a ¼ wavelength plate. The reflective linear polarizer and the ¼ wavelength plate used may be the same as the reflective linear polarizer and the ¼ wavelength plate described above as examples of the circular polarizer 20. The slow axis of the ¼ wavelength plate of the aforementioned circular polarizer 20 is preferably perpendicular to the slow axis of the ¼ wavelength plate of the circularly polarized light selective reflector 50.

The circularly polarized light selective reflector 50 may be a cholesteric liquid crystal element. In the case where the circularly polarized light selective reflector 50 is a cholesteric liquid crystal element, it may be the same as the cholesteric liquid crystal element 23 described above as examples for the circular polarizer 20. The light transmitted through the cholesteric liquid crystal element is circularly polarized light. In the case where the circular polarizer 20 and the circularly polarized light selective reflector 50 are both cholesteric liquid crystal elements, the circularly polarized light transmitted through the cholesteric liquid crystal element as the circular polarizer 20 and the circularly polarized light transmitted through the cholesteric liquid crystal element serving as the circularly polarized light selective reflector 50 preferably rotate in opposite directions (clockwise and counter clockwise).
(Focusing Lens)

In order to increase the light use efficiency, focusing lenses 60 may be provided that focus the light on the light transmitters 31 of the patterning mirror 30. Common self-luminous panels such as OLED or QD-LED panels are Lambertian emitters and thus have a wide viewing angle range. However, in an optical system utilizing a virtual image, such as a VR device, the light at an angle closer to the normal direction of the display device 100 (e.g., within ±30 degrees from the normal direction) contributes to display of an image, but the light at a greater angle hardly contributes to display of an image, although this depends on the design. Accordingly, placing a focusing lens can increase the light use efficiency.

Figure 7:
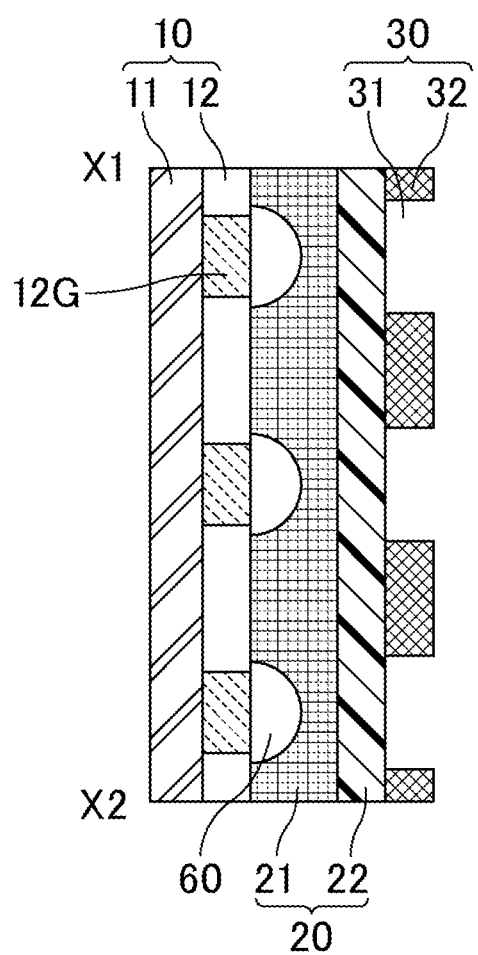
FIG. 7 is a schematic cross-sectional view of a first example in which focusing lenses are provided.

FIG. 7 is a schematic cross-sectional view of a first example in which focusing lenses are provided. As shown in FIG. 7, the focusing lenses 60 may be provided between the display panel 10 and the circular polarizer 20. In the case of being provided between the display panel 10 and the circular polarizer 20, the focusing lenses 60 are preferably provided such that the convex portions are close to the patterning mirror 30. In the case where the circular polarizer 20 is a stack of the first linear polarizer 21 and the ¼ wavelength plate 22, the focusing lenses 60 may be provided between the display panel 10 and the first linear polarizer 21.

Figure 8:
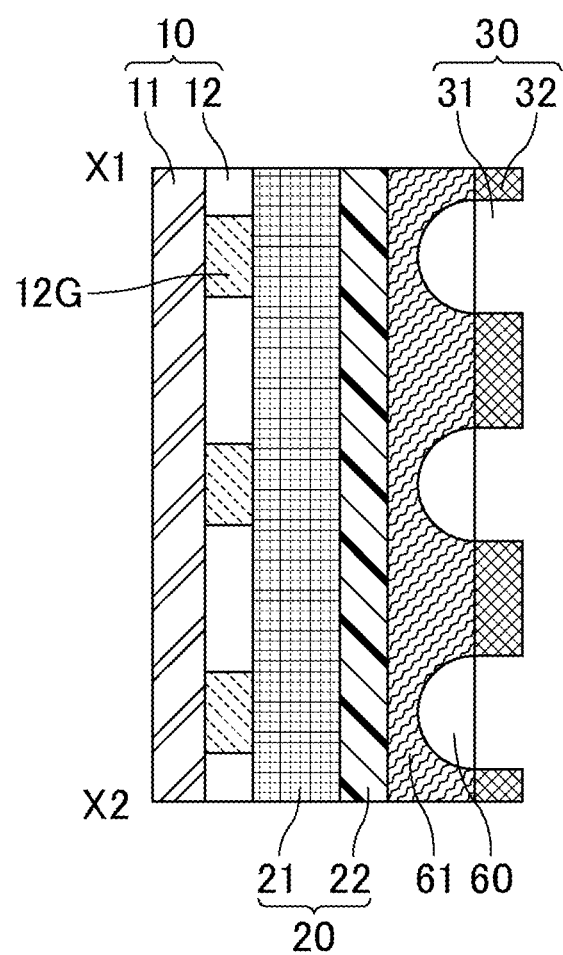
FIG. 8 is a schematic cross-sectional view of a second example in which focusing lenses are provided.

FIG. 8 is a schematic cross-sectional view of a second example in which focusing lenses are provided. As shown in FIG. 8, the focusing lenses 60 may be provided between the circular polarizer 20 and the patterning mirror 30. In the case of being provided between the circular polarizer 20 and the patterning mirror 30, the focusing lenses 60 are preferably provided such that the convex portions are close to the display panel 10. In the case where the circular polarizer 20 is a stack of the first linear polarizer 21 and the ¼ wavelength plate 22, the focusing lenses 60 may be provided between the ¼ wavelength plate 22 and the patterning mirror 30. An adhesive layer 61 may be provided between the focusing lenses 60 and the circular polarizer 20.

Placing the focusing lenses 60 so as to overlap at least one of the light transmitters 31 allows the light emitted from the display panel 10 to have directivity and to focus on the overlapping light transmitter(s) 31. The focusing lenses 60 may be provided for the respective pixels. In order to reduce chromatic aberration, each of the focusing lenses 60 used may be a lens of which the refractive index is optimized for each of the red, green, and blue pixels.

Examples of the focusing lens 60 include a microlens and a hologram film.

The microlens may be a convex lens having a diameter of 30 to 40 μm. The microlens may have a radius of curvature of 20 to 30 μm. The microlens may have a height of 5 to 20 μm. The microlens preferably has a curved surface, and may be a hemisphere or may have a dome shape. A microlens array may be used in which microlenses are arranged.

The hologram film used may be a transmissive holographic film. Using a transmissive hologram film which stores the same optical functions as those of the aforementioned microlens can provide the same light-focusing effect.

Embodiment 2

A display device according to Embodiment 2 includes a liquid crystal panel as a display panel. In Embodiment 2, the display panel is a liquid crystal panel including paired substrates and a liquid crystal layer sandwiched between the paired substrates. The circular polarizer includes a stack of a first linear polarizer and a ¼ wavelength plate, and the display panel further includes a second linear polarizer remote from the circular polarizer. The same structures as those in Embodiment 1 are not elaborated upon herein.

Figure 9:
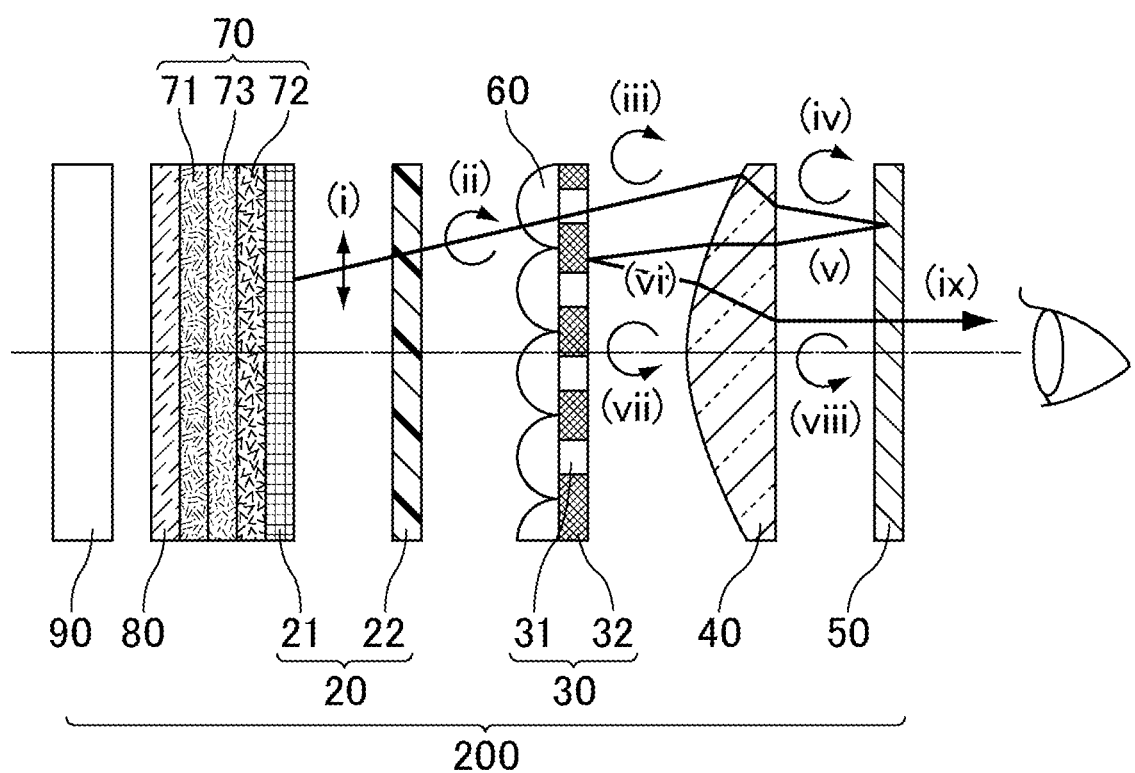
FIG. 9 is an exploded schematic cross-sectional view of a display device according to Embodiment 2.

FIG. 9 is an exploded schematic cross-sectional view of the display device according to Embodiment 2. In a display device 200 according to Embodiment 2, a display panel (liquid crystal panel) 70 includes paired substrates 71 and 72 and a liquid crystal layer 73 sandwiched between the paired substrates 71 and 72. The substrate 71 may be a TFT substrate and the substrate 72 may be a counter substrate.

As described in Embodiment 1, the TFT substrate 71 may include, on a support substrate, parallel gate lines, parallel source lines extending in the direction intersecting the gate lines with a gate insulator in between, and a TFT at each intersection of a gate line and a source line for each pixel.

The liquid crystal panel may have any display mode, and may be a horizontal alignment (horizontal electric field) mode liquid crystal panel in which the counter electrode is provided on the TFT substrate 71, or may be a vertical alignment (vertical electric field) mode liquid crystal panel in which the counter electrode is provided on the counter substrate 72 with the liquid crystal layer 73 in between.

Figure 10:
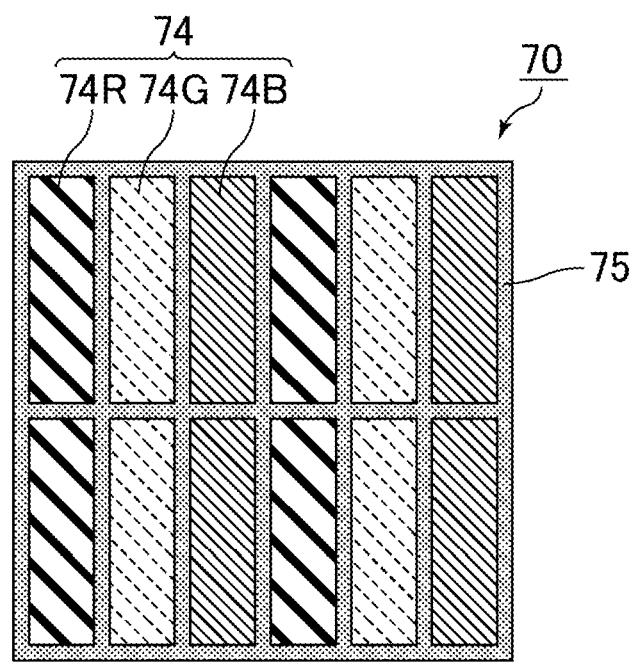
FIG. 10 is a schematic plan view of the liquid crystal panel of FIG. 9.

FIG. 10 is a schematic plan view of the liquid crystal panel shown in FIG. 9. The counter substrate 72 may be a color filter (CF) substrate including a support substrate and, on the support substrate, a black matrix and a CF layer.

The CF substrate may have a structure in which color filters 74 are arranged in a plane and are partitioned by a black matrix 75, for example. The color filters 74 may include red color filters 74R, green color filters 74G, and blue color filters 74B. The color filters 74 may be arranged in a stripe arrangement in which the red, green, and blue color filters are repeatedly arranged in the row direction while the same color filters 74R, 74G, or 74B are arranged in the column direction. The pixels overlapping the red color filters 74R, the pixels overlapping the green color filters 74G, and the pixels overlapping the blue color filters 74B serve as red, green, and blue pixels, respectively.

The black matrix 75 used may be one commonly used in the field of liquid crystal panels, and may be one formed from a resin containing a black pigment, for example. The black matrix 75 may be provided in a grid pattern so as to overlap the gate lines and/or the source lines in a plan view.

The liquid crystal layer 73 contains liquid crystal molecules. When a voltage is applied between the common electrode and pixel electrodes, an electric field is generated in the liquid crystal layer 73 and, in accordance with the electric field, the alignment of the liquid crystal molecules is changed, controlling the amount of light transmitted. The alignment azimuth of the liquid crystal molecules when no voltage is applied is controlled by the control force of the alignment film. The term "when no voltage is applied" means that voltage is not applied to the liquid crystal layer 73 between the paired electrodes or a voltage is applied but is lower than the threshold value of the liquid crystal molecules.

The liquid crystal molecules may have either a positive or negative anisotropy of dielectric constant (Δε) defined by the following formula.

$$\Delta\varepsilon = (\text{dielectric constant in major axis direction}) - (\text{dielectric constant in minor axis direction})$$

An alignment film may be provided between the TFT substrate and the liquid crystal layer 73 and between the counter substrate and the liquid crystal layer 73. When no voltage is applied to the liquid crystal layer 73, the alignment film(s) mainly acts to control the alignment of the liquid crystal molecules. For example, in the case of a horizontal alignment mode, the liquid crystal molecules when no voltage is applied may have a tilt angle (pre-tilt angle) of 0° to 5°, preferably 0° to 3°, more preferably 0° to 1°. The tilt angle of the liquid crystal molecules means the angle of the major axis (optical axis) of the liquid crystal molecules to the surfaces of the TFT substrate and the counter substrate.

The second linear polarizer 80 is provided on the liquid crystal panel 70 remote from the circular polarizer 20 (close to the back surface of the liquid crystal panel 70). The transmission axis of the first linear polarizer 21 and the transmission axis of the second linear polarizer 80 are preferably provided in crossed Nicols so as to be perpendicular to each other. The second linear polarizer 80 used may be the same as the first linear polarizer 21.

A normally black mode is taken as an example. In a plan view, the alignment azimuth of the liquid crystal molecules is oriented substantially parallel to the transmission axis of either the first or second linear polarizer 21 or 80 when no voltage is applied. The light incident on the back surface of the liquid crystal panel passes through the second linear polarizer 80 and is converted into linearly polarized light. The linearly polarized light passes through the liquid crystal layer 73 but does not pass through the first linear polarizer 21. Thereby, the liquid crystal panel shows a black screen. In contrast, when a voltage is applied to the liquid crystal layer 73, the alignment azimuth of the liquid crystal molecules changes from the initial alignment azimuth and the major axis direction of the liquid crystal molecules forms an angle with the transmission axes of the first and second linear polarizers 21 and 80, so that the light passes through the first linear polarizer 21. Thereby, the liquid crystal panel shows a white screen.

In Embodiment 2, the linearly polarized light transmitted through the first linear polarizer 21 passes through the ¼ wavelength plate 22 and is thereby converted into circularly polarized light. In the case of using the aforementioned cholesteric liquid crystal element as a circular polarizer, the light reflected on the cholesteric liquid crystal element serves as stray light and is emitted toward a viewer at a position or angle different from that achieved when the light is emitted through an expected light transmitter 31. This may serve as a cause of blurred image, reducing the display quality of the liquid crystal panel. In order to reduce or prevent this problem, in Embodiment 2 where a liquid crystal panel is used as a display panel, the circular polarizer used is preferably a stack of the first linear polarizer 21 and the ¼ wavelength plate 22.

In Embodiment 2, as in Embodiment 1, the focusing lenses 60 may be provided that focus the light on the light transmitters 31 of the patterning mirror 30. The pixels of the liquid crystal panel commonly have a larger area than the pixels of a self-luminous panel. Thus, efficiently focusing the display light onto the light transmitters 31 of the patterning mirror 30 can improve the luminance of the display device 200.

The focusing lenses 60 preferably overlap at last one of the light transmitters 31, and may be provided between the circular polarizer 20 and the patterning mirror 30 or may be provided between the patterning mirror 30 and the circularly polarized light selective reflector 50. In the case where the circular polarizer 20 is a stack of the first linear polarizer 21 and the ¼ wavelength plate 22, the focusing lenses 60 may be provided between the liquid crystal panel 70 and the first linear polarizer 21 or may be provided between the ¼ wavelength plate 22 and the patterning mirror 30.

Figure 11:
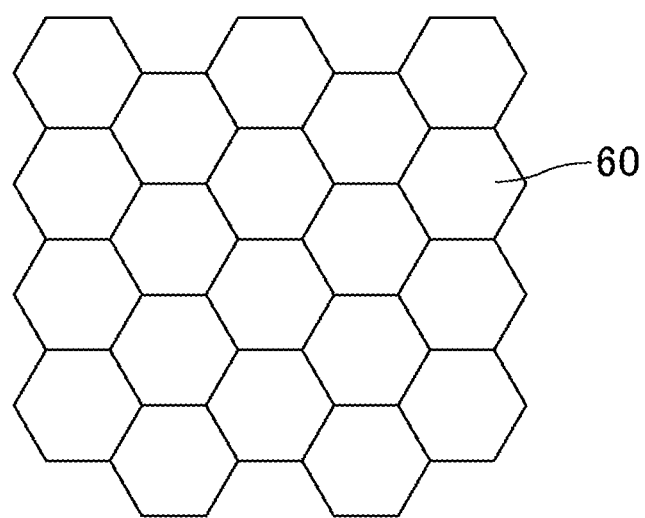
FIG. 11 is a schematic plan view of an example of microlenses.
Figure 12:
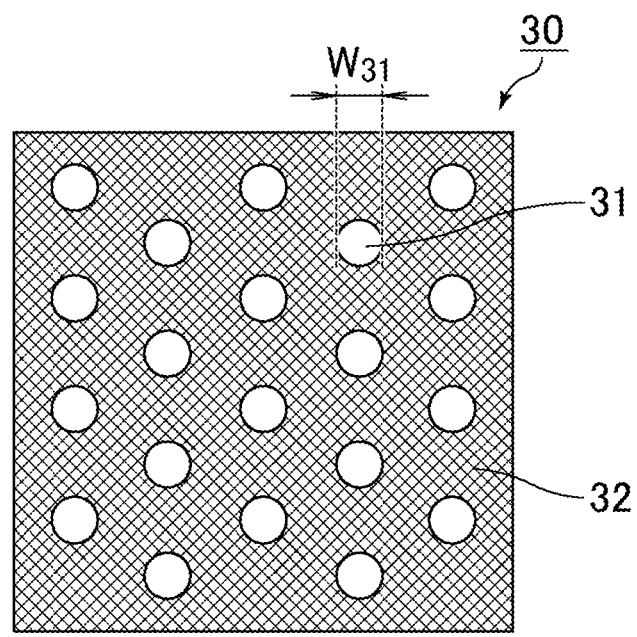
FIG. 12 is a schematic plan view of another example of the patterning mirror.
Figure 13:
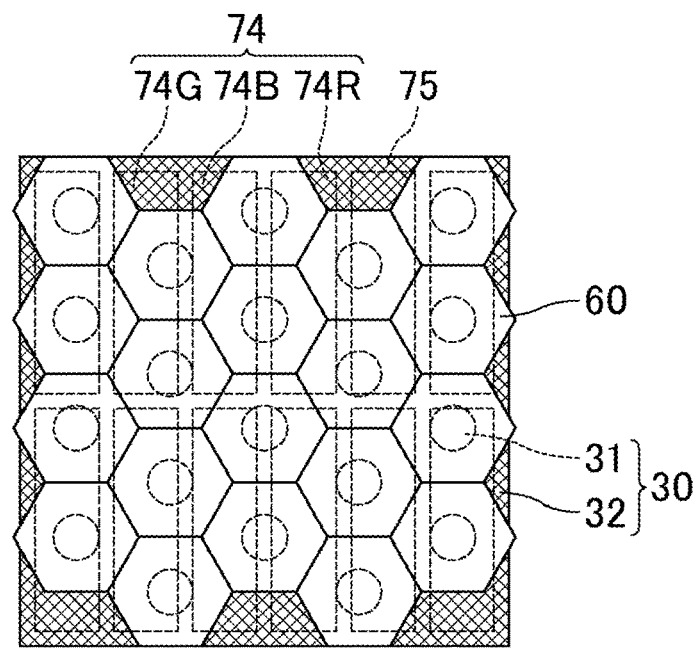
FIG. 13 is a schematic plan view of an overlapping structure of the liquid crystal panel in FIG. 10, the microlenses in FIG. 11, and the patterning mirror in FIG. 12.

FIG. 11 is a schematic plan view of an example of the microlenses. FIG. 12 is a schematic plan view of another example of the patterning mirror. FIG. 13 is a schematic plan view of an overlapping structure of the liquid crystal panel in FIG. 10, the microlenses in FIG. 11, and the patterning mirror in FIG. 12. As shown in FIG. 11, in a plan view, the microlenses may be arranged in a hexagonally close-packed structure, i.e., arranged such that six lenses are adjacent to each other to surround one lens. As shown in FIG. 12 and FIG. 13, the light transmitters 31 of the patterning mirror 30 may overlap the microlenses. In the example of FIG. 12, each light transmitter 31 has a circular planar shape.

As shown in FIG. 13, each light transmitter 31 of the patterning mirror 30 does not necessarily overlap the whole of one pixel but overlaps at least part of one pixel. Arranging the microlenses in a hexagonally close-packed structure in a plan view can increase the luminance of the display device 200 including the pixels arranged in an RGB striped arrangement even without precisely aligning the positions of the light transmitters 31 and the positions of the pixels.

(Backlight)

The display device 200 according to Embodiment 2 may further include a backlight facing the second linear polarizer 80 and remote from the liquid crystal panel 70, the backlight including a light source.

The backlight may be of a direct-lit type or an edge-lit type. The direct-lit backlight includes a light source facing the back surface of the liquid crystal panel. The edge-lit backlight includes a light guide plate facing the back surface of the liquid crystal panel and a light source on a side surface of the light guide plate. The edge-lit backlight emits light from the light source to the side surface of the light guide plate and then emits light from the light guide plate toward the liquid crystal panel. A reflection sheet may be provided on the back surface of the light guide plate. Between the light guide plate and the display device 200 may be provided a prism sheet, a diffuser, or other component.

The backlight preferably focuses the light emitted from the light source in the direction along the thickness direction of the liquid crystal panel. Preferably, the backlight then emits the focused light toward the liquid crystal panel. The backlight may have a half width (full width at half maximum) of 15° to 30°. The half width can be defined by measuring the luminance-viewing angle characteristics by the method in conformity with IEC61747-30 within the angle range where the luminance is not lower than the half of the maximum luminance.

Figure 14:
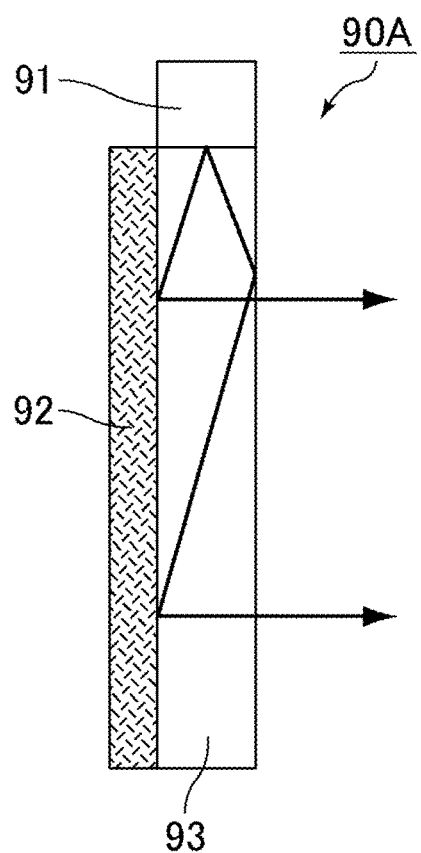
FIG. 14 is a schematic cross-sectional view of a first example of an edge-lit backlight.

An example of the directive backlight is shown below. FIG. 14 is a schematic cross-sectional view of a first example of the edge-lit backlight. As shown in FIG. 14, a backlight 90A includes a laser light source 91 as a light source on a side surface of a light guide plate 93, and may include a reflector 92 on the back surface of the light guide plate 93.

The light guide plate 93 may be any one commonly used in the field of backlights. The reflector 92 may be a reflective hologram film. The reflective hologram film used may be a volume hologram film. An example of the volume hologram film may be one prepared by exposure using, as emission light beams, an incident light beam from the laser light source 91 and a parallel light beam emitted from the reflector toward the light guide plate along the normal direction of the light guide plate. The backlight 90A including the laser light source 91 as a light source and a reflective hologram film as the reflector 92 can have increased directivity of the backlight.

Figure 15:
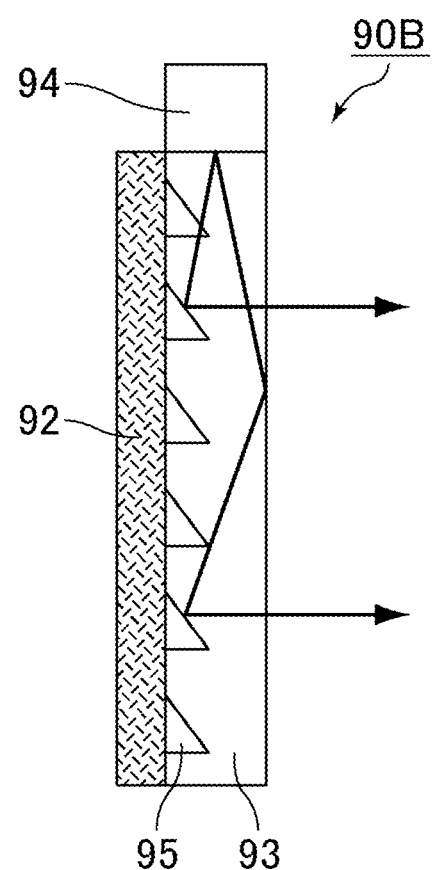
FIG. 15 is a schematic cross-sectional view of a second example of the edge-lit backlight.

FIG. 15 is a schematic cross-sectional view of a second example of the edge-lit backlight. As shown in FIG. 15, a backlight 90B includes an LED light source 94 as a light source and a prism film 95 that is provided between the reflector 92 and the light guide plate 93 and that is provided with protrusions close to the liquid crystal panel 70. The reflector 92 may be, but is not limited to, one including a refection layer formed from aluminum, silver, or the like. The backlight 90B including the prism film 95 can have increased directivity.

Figure 16:
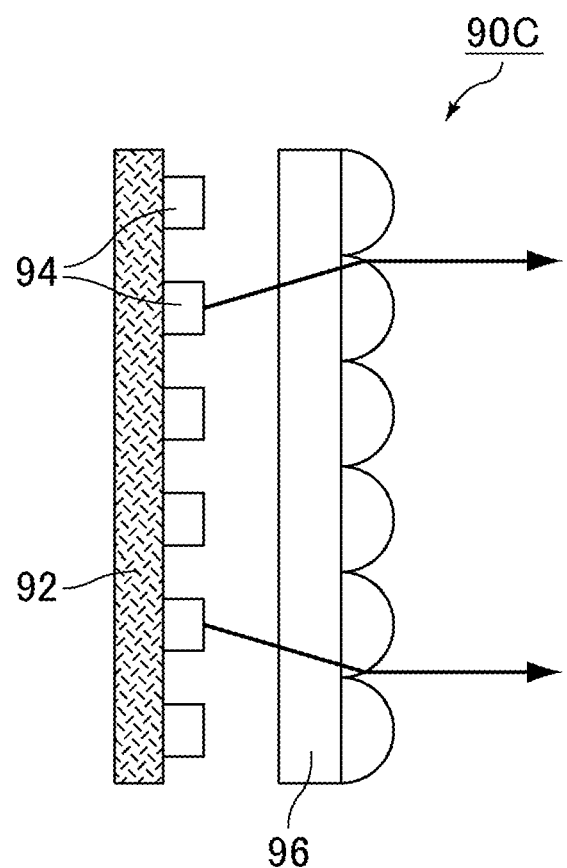
FIG. 16 is a schematic cross-sectional view of an example of a direct-lit backlight.

FIG. 16 is a schematic cross-sectional view of an example of the direct-lit backlight. As shown in FIG. 16, a backlight 90C includes LED light sources 94 on a surface of the reflector 92 and a microlens film 96 as a light condenser adjacent to the liquid crystal panel 70. The light condenser may be any one that condenses the light in the direction of light emission, and may be one commonly used in the field of backlights. The microlens film 96 may be one including hemispherical lenses arranged. The reflector 92 may be, but is not limited to, one including a refection layer formed from aluminum, silver, or the like. The backlight 90C including the microlens film 96 can have increased directivity.

Provided that the in-plane azimuth (e.g., the plane parallel to the backlight or the display panel) corresponds to the x-axis and the axis perpendicular to the x-axis corresponds to the y-axis, the backlight may focus the light along both the x-axis and the y-axis, or may focus the light along either the x-axis or the y-axis. An example of the backlight that focuses the light along the directions of the two axes is one including the microlens film 96 as a light condenser. An example of the backlight that focuses the light along the direction of one axis is one including, as a light condenser, a lenticular lens composed of semicylindrical lenses. In the case of using a lenticular lens, the backlight may be an antiprism backlight including a prism film provided with protrusions away from the liquid crystal panel 70.

The laser light source 91 and the LED light source 94 each may emit white light. In the case where the laser light source 91 includes red, green, and blue laser light sources or the LED light source 94 includes red, green, and blue LEDs, the liquid crystal panel 70 can achieve color display by field sequential driving without a color filter on the counter substrate.

Embodiment 3

A head-mounted display according to Embodiment 3 includes the display device of any of the above embodiments and a mounting part to be mounted on a head. The HMD according to Embodiment 3 may be an immersive HMD having a housing to shield the eyes of a user from the outside light when mounted, or may be an eyewear (eyeglass-type) HMD.

In the case of an immersive HMD, the mounting part may be a mounting band to fix the display device to the head of a user. The HMD may further include a face cushion to be placed between the display device and the face of a user. In the case of an eyewear HMD, the parts corresponding to the lenses of the eyewear may serve as the display device and the mounting part may be the frame of the eyewear to be hung on the ears of a user.

The HMD may be of a single display system including one display panel for both the right and left eyes or may be of a dual display system including two display panels respectively for the right and left eyes. The immersive HMD is applicable to both the single display system and the dual display system. The eyewear HMD is applicable to the dual display system.

The HMD may further include an acoustic output device having a function of generating sounds such as voice, music, and sound effects.

EXAMPLES

The present invention is described in more detail below with reference to examples, but the present invention is not limited to these examples.

Example 1-1

A specific example of Embodiment 1 having the structure shown in FIG. 1, specifically, a single display system display device was produced which sequentially includes an OLED panel, a linear polarizer, a ¼ wavelength plate, a patterning mirror, a lens, and a circularly polarized light selective reflector.

The OLED panel used was an OLED panel including red, green, and blue OLEDs. To the OLED panel were attached a linear polarizer having a thickness of about 40 µm and a ¼ wavelength plate having a thickness of about 45 µm in the stated order using adhesive material. The total thickness of the linear polarizer, the ¼ wavelength plate, and the adhesive material was 120 µm. Metal was directly vapor-deposited on the surface of the ¼ wavelength plate away from the linear polarizer, whereby a patterning mirror was formed. The lens used was a double convex lens of which the radius of curvature of the lens surface close to a viewer is greater than the radius of curvature of the lens surface close to the panel. The double convex lens used may be a double convex lens having a relatively sharp curve (e.g., having a radius of curvature of 50 mm or smaller) on the lens surface close to the panel while having a relatively gentle curve (e.g., having a radius of curvature of 80 mm or greater) on the lens surface close to a viewer. The circularly polarized light selective reflector used was prepared by attaching a ¼ wavelength plate to a reflective linear polarizer using adhesive material.

Figure 17:
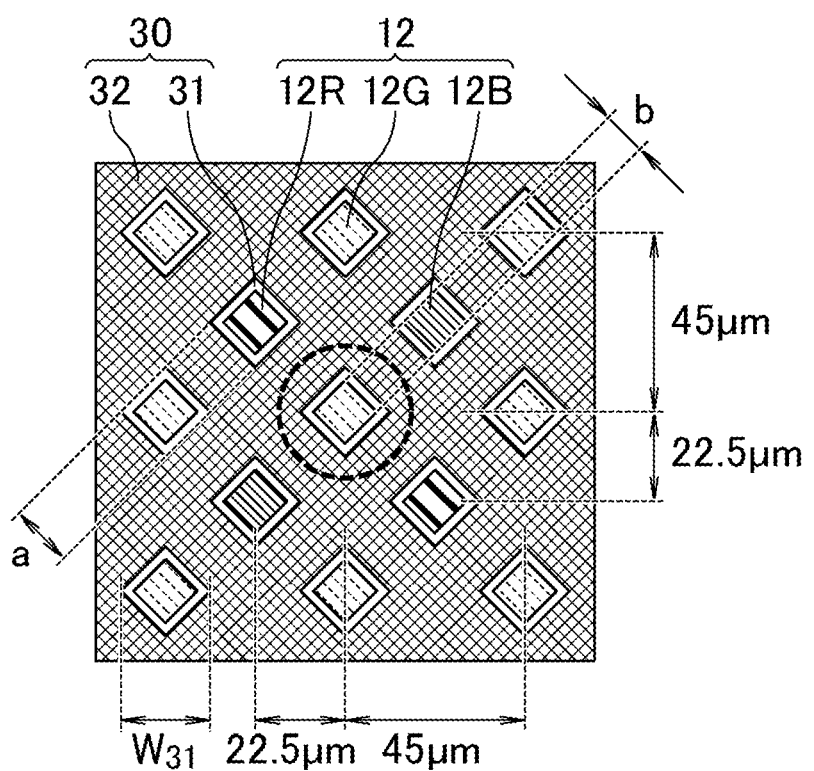
FIG. 17 is a schematic plan view of an overlapping structure of a patterning mirror and an OLED panel used in the examples.

FIG. 17 is a schematic plan view of an overlapping structure of the patterning mirror and the OLED panel used in the examples. The OLED panel used included, as light-emitting elements, red, green, and blue OLEDs arranged in the pentile arrangement. The red, green, and blue OLEDs had a length b of each side of 12 µm. The red, green, and blue OLEDs were arranged at intervals shown in FIG. 17. OLEDs adjacent to each other in the row direction and the column direction were apart from each other by a distance of 45 µm and the scaled resolution was set to 564 ppi. The light transmitters each had a square planar shape having a length of each side a of 20 µm ($W_{31}$: 28.3 µm). In Example 1, the light transmitters overlapping the respective red, green, and blue OLEDs had the same size. The patterning mirror had an aperture ratio of 35%.

Example 1-2

A display device had the same structure as in Example 1-2 except that focusing lenses were provided between the OLED panel and the linear polarizer as shown in FIG. 7. The focusing lenses were microlenses arranged to overlap the respective pixels. Each microlens was a dome-shaped convex lens having a circular planar shape (diameter φ=20 µm), a radius of curvature of 20 µm, and a height of 2.5 µm. The microlenses were provided such that the convex shape was close to the patterning mirror.

Example 1-3

A display device according to Example 1-3 had the same structure as in Example 1-2 except that the diameter and the height of each microlens were changed respectively to 30 µm and 7 µm while the radius of curvature remained 20 µm.

Example 1-4

A display device according to Example 1-4 had the same structure as in Example 1-2 except that the diameter and the height of each microlens were changed respectively to 40 µm and 20 µm while the radius of curvature remained 20 µm.

Example 2-1

A display device according to Example 2-1 had the same structure as in Example 1-1 except that the display device sequentially included an OLED panel, a linear polarizer, a ¼ wavelength plate, a patterning mirror, a lens, and a circularly polarized light selective reflector in the stated order and that each light transmitter of the patterning mirror had a square shape having a length of each side a of 15 µm (maximum length: 21.2 µm).

Example 2-2

A display device according to Example 2-2 had the same structure as in Example 2-1 except that focusing lenses were provided between the OLED panel and the linear polarizer. Each focusing lens used was, as in Example 1-2, a dome-shaped microlens having a circular planar shape (diameter φ=20 μm), a radius of curvature of 20 μm, and a height of 2.5 μm.

Example 2-3

A display device according to Example 2-3 had the same structure as in Example 2-2 except that the diameter and the height of each microlens were changed respectively to 30 μm and 7 μm while the radius of curvature remained 20 μm.

Example 2-4

A display device according to Example 2-4 had the same structure as in Example 2-2 except that the diameter and the height of each microlens were changed respectively to 40 μm and 20 μm while the radius of curvature remained 20 μm.

<Examination on Light Use Efficiency in Reflection>

The reflectance of the patterning mirror was measured by the method in conformity with JIS R 3220 "Glass in building-Silvered, flat-glass mirror". The patterning mirrors used in Examples 1-1 to 1-4, of which each light transmitter had a length of each side of 20 μm, had an aperture ratio of about 60% and a reflectance of the vapor-deposited silver of about 95%, and thus had a reflectance of about 57%. Similarly, the patterning mirrors used in Examples 2-1 to 2-4, of which each light transmitter had a length of each side of 15 μm, had a reflectance of about 74%. In contrast, the reflectance of a conventional half mirror was 50%. Therefore, the light use efficiency in reflection in Examples 1-1 to 1-4 was demonstrated to be about 1.15 times as high as that of a HMD including the conventional half mirror. Similarly, the light use efficiency in reflection in Examples 2-1 to 2-4 was demonstrated to be about 1.48 times as high as that of the HMD including the conventional half mirror.

<Examination of Light Use Efficiency in Transmission>

The luminance-viewing angle relationship in the examples were simulated by the following method. As shown in FIG. 17, within the range including nine green LEDs, two red LEDs, and two blue LEDs, i.e., 13 LEDs in total, the central green LED circled by a dotted line in FIG. 17 alone was turned on and the luminances of the light beams emitted from the 13 light transmitters overlapping the 13 LEDs were integrated. The simulation was performed using "LightTools" available from Cybernet Systems Co., Ltd.

Figure 18:
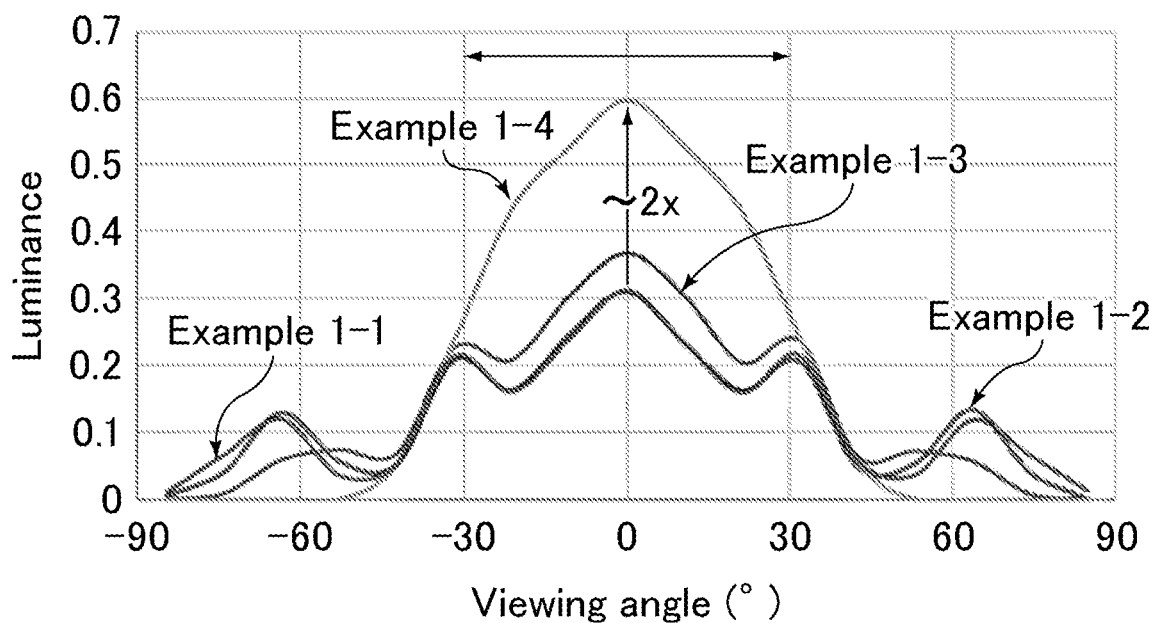
FIG. 18 is a graph of the luminance-viewing angle relationship in Examples 1-1 to 1-4.
Figure 19:
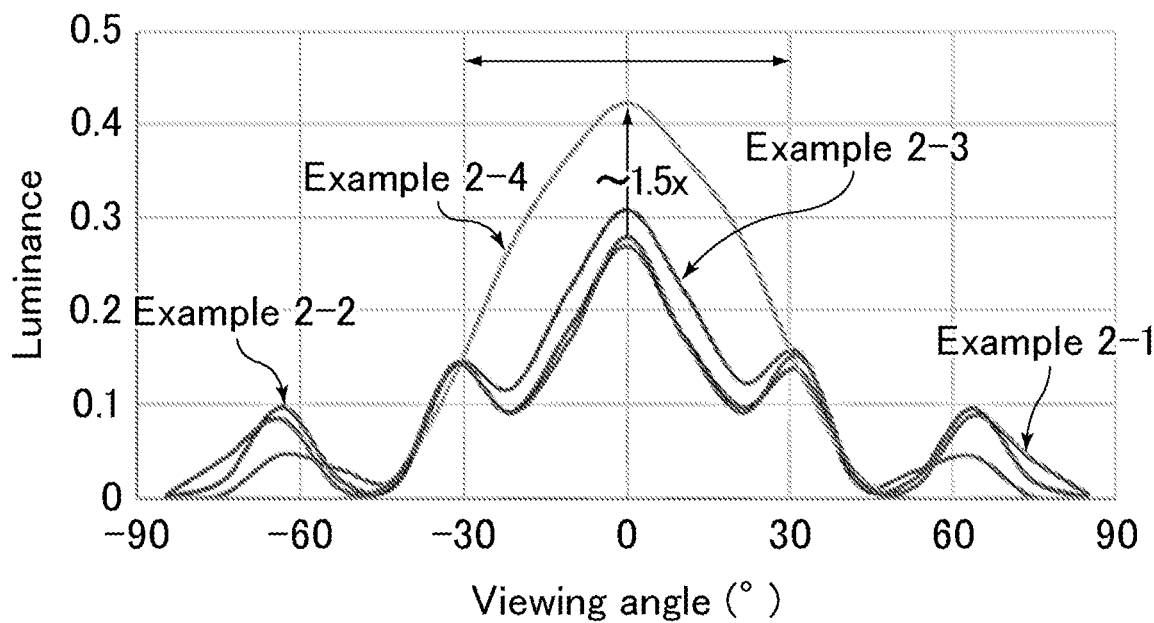
FIG. 19 is a graph of the luminance-viewing angle relationship in Examples 2-1 to 2-4.

The results are shown in FIG. 18 and FIG. 19. FIG. 18 is a graph showing the luminance-viewing angle relationship in Examples 1-1 to 1-4. FIG. 19 is a graph showing the luminance-viewing angle relationship in Examples 2-1 to 2-4.

In FIG. 18 and FIG. 19, the viewing angle is defined such that, when the display device is observed from a viewer, the normal direction is 0°, the positive viewing angles are ranged on the right side of the display device from the 0° point, and the negative viewing angles are ranged on the left side thereof.

FIG. 18 shows that, in the cases where each light transmitter of the patterning mirror was a 20-μm square, the luminance at a viewing angle of 0° in Example 1-4, in which each microlens used had a diameter of 40 μm and a height of 20 μm, was about double the luminance in Example 1-1 without the microlenses. FIG. 19 shows that, in the cases where each light transmitter of the patterning mirror was a 15-μm square, the luminance at a viewing angle of 0° in Example 2-4, in which each microlens used had a diameter of 40 μm and a height of 20 μm, was about 1.5 times the luminance in Example 2-1 without the microlenses. These results demonstrate providing the microlenses can improve the light use efficiency in transmission.

In Examples 1-4 and 2-4, the luminance was increased around the center of the visual field (the viewing angle range of −30° to +30°) that contributes to an image in a HMD. This demonstrates applying the display device including the microlenses to a HMD can lead to a HMD with a lower electric energy consumption.

In comparison with a HMD including a conventional half mirror, the total light use efficiency in consideration of the light use efficiencies in reflection and in transmission was 2×1.15=about 2.3 times in Example 1-4 and 1.5×1.48=about 2.2 times in Example 2-4.

REFERENCE SIGNS LIST

10: display panel (self-luminous panel)
11, 71, 72: substrate
12: light-emitting layer
12R: red LED
12G: green LED
12B: blue LED
20: circular polarizer
21: first linear polarizer
22: ¼ wavelength plate
23: cholesteric liquid crystal element
30: patterning mirror
31: light transmitter
32: light reflector
40: lens
50: circularly polarized light selective reflector
60: focusing lens
61: adhesive layer
70: display panel (liquid crystal panel)
73: liquid crystal layer
74, 74R, 74G, 74B: color filter
75: black matrix
80: second linear polarizer
90, 90A, 90B, 90C: backlight
91: laser light source
92: reflector
93: light guide plate
94: LED light source
95: prism film
96: microlens film
100, 200: display device

What is claimed is:

1. A display device comprising:
   a display panel;
   a circular polarizer configured to convert display light from the display panel into circularly polarized light and to transmit the circularly polarized light;
   a patterning mirror including a light reflector and light transmitters surrounded by the light reflector, the light transmitters being configured to transmit the circularly polarized light and the light reflector being provided on a surface opposite a surface facing the circular polarizer;
   a lens configured to transmit the circularly polarized light transmitted through the light transmitters; and
   a circularly polarized light selective reflector configured to selectively reflect the circularly polarized light transmitted through the lens.

2. The display device according to claim 1, wherein each of the light transmitters overlaps at least one of pixels in the display panel.

3. The display device according to claim 1, wherein the display panel includes an organic light emitting diode or a quantum dot light emitting diode.

4. The display device according to claim 1, wherein the circular polarizer includes a stack of a first linear polarizer and a ¼ wavelength plate.

5. The display device according to claim 1, wherein the circular polarizer comprises a cholesteric liquid crystal element.

6. The display device according to claim 1, wherein the display panel comprises a liquid crystal panel including a pair of substrates and a liquid crystal layer between the pair of substrates, the circular polarizer includes a stack of a first linear polarizer and a ¼ wavelength plate, and the display panel includes a second linear polarizer remote from the circular polarizer.

7. The display device according to claim 6, further comprising a backlight facing the second linear polarizer and remote from the liquid crystal panel, the backlight including a light source, wherein the backlight is configured to focus light emitted from the light source along a thickness direction of the liquid crystal panel.

8. The display device according to claim 1, wherein the circularly polarized light selective reflector includes a stack of a reflective linear polarizer and a ¼ wavelength plate.

9. The display device according to claim 1, wherein the circularly polarized light selective reflector comprises a cholesteric liquid crystal element.

10. The display device according to claim 1, further comprising a focusing lens between the display panel and the circular polarizer, the focusing lens overlapping at least one of the light transmitters.

11. The display device according to claim 1, further comprising a focusing lens between the circular polarizer and the patterning mirror, the focusing lens overlapping at least one of the light transmitters.

12. A head-mounted display comprising:

the display device according to claim 1; and a mounting part to be mounted on a head.

13. The display device according to claim 1, wherein the light transmitters are spaced from each other in the light reflector in a plan view.

14. The display device according to claim 1, wherein the light transmitters are arranged in a regular pattern.

15. The display device according to claim 1, wherein the light reflector has a matrix pattern.

16. The display device according to claim 1, wherein the light transmitters have a transmittance of 90% or higher, and the light reflector has a reflectance of 83% or higher.

17. The display device according to claim 1, wherein the light reflector overlaps an area between pixels in the display panel and does not overlap the pixels in a plan view.

18. The display device according to claim 1, wherein the display panel includes pixels, the pixels include a first pixel that emits a first color, a second pixel that emits a second color and that has a greater size than the first pixel, and a third pixel that emits a third color and that has a greater size than the first pixel, and the light transmitters include a first light transmitter that overlaps the first pixel, a second light transmitter that overlaps the second pixel and that has a greater size than the first light transmitter, and a third light transmitter that overlaps the third pixel and that has a greater size than the first light transmitter.

19. The display device according to claim 1, wherein the light reflector is provided with a metal film, and the light transmitters are not provided with the metal film.

20. The display device according to claim 1, wherein the surface of the patterning mirror close to the display panel is provided with a light absorber body.

* * * * *